US010643914B2

(12) United States Patent
Takematsu et al.

(10) Patent No.: US 10,643,914 B2
(45) Date of Patent: May 5, 2020

(54) SEMICONDUCTOR DEVICE

(71) Applicant: Fuji Electric Co., Ltd., Kawasaki-shi, Kanagawa (JP)

(72) Inventors: Yuji Takematsu, Kawasaki (JP); Kenji Okamoto, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/199,012

(22) Filed: Jun. 30, 2016

(65) Prior Publication Data
US 2017/0053847 A1 Feb. 23, 2017

(30) Foreign Application Priority Data

Aug. 18, 2015 (JP) .................................. 2015-161170

(51) Int. Cl.
*H01L 23/29* (2006.01)
*H01L 23/00* (2006.01)
(Continued)

(52) U.S. Cl.
CPC .......... *H01L 23/295* (2013.01); *H01L 23/296* (2013.01); *H01L 23/3135* (2013.01); *H01L 23/3142* (2013.01); *H01L 23/562* (2013.01); *B29K 2063/00* (2013.01); *H01L 23/3121* (2013.01)

(58) Field of Classification Search
CPC .................. H01L 23/295; H01L 23/296; H01L 2924/186; H01L 2251/568; H01L 2251/5369; H01L 23/3135; H01L 23/3142; B29K 2063/00
See application file for complete search history.

(56) References Cited

U.S. PATENT DOCUMENTS 4,624,998 A * 11/1986 Keil ........................ C08L 63/00
523/435
5,981,313 A * 11/1999 Tanaka .................. H01L 21/563
257/788

(Continued)

FOREIGN PATENT DOCUMENTS

JP H0740491 A 2/1995
JP H0852810 A 2/1996
(Continued)

OTHER PUBLICATIONS

Japanese Office Action for Application No. 2015-161170 dated Mar. 15, 2019, 4 pages.

*Primary Examiner* — Zandra V Smith
*Assistant Examiner* — Abbigale A Boyle
(74) *Attorney, Agent, or Firm* — Lerner, David, Littenberg, Krumholz & Mentlik, LLP

(57) ABSTRACT

Provided is a semiconductor device capable of self-repairing cracks or peels occurring in sealing materials. A semiconductor module includes a member including a semiconductor element, an insulating substrate bonded onto one surface of the semiconductor element, and a printed circuit board for coupling with an external circuit connected to the other surface of the semiconductor element, which are sealed with a sealing material. In the semiconductor module, the sealing material includes a first thermosetting resin and a microcapsule particle containing a second thermosetting resin precursor.

12 Claims, 2 Drawing Sheets

(51) Int. Cl.
    *H01L 23/31*    (2006.01)
    *B29K 63/00*    (2006.01)

(56) References Cited

U.S. PATENT DOCUMENTS

| | | | |
|---|---|---|---|
| 9,356,002 B2* | 5/2016 | Im | H01L 23/49541 |
| 2004/0007784 A1* | 1/2004 | Skipor | B01J 13/02 |
| | | | 257/788 |
| 2007/0013067 A1* | 1/2007 | Nishida | H01L 21/563 |
| | | | 257/737 |
| 2007/0029653 A1* | 2/2007 | Lehman, Jr. | H01L 21/563 |
| | | | 257/678 |
| 2011/0156234 A1 | 6/2011 | Hu | |
| 2014/0024765 A1 | 1/2014 | Nunoshige et al. | |
| 2014/0124936 A1* | 5/2014 | Yanagawa | H01L 25/072 |
| | | | 257/762 |
| 2015/0168827 A1* | 6/2015 | Yang | G02B 1/04 |
| | | | 430/280.1 |

FOREIGN PATENT DOCUMENTS

| | | |
|---|---|---|
| JP | 200331063 A | 1/2003 |
| JP | 2006179538 A | 7/2006 |
| JP | 2008540733 A | 11/2008 |
| JP | 2011011164 A | 1/2011 |
| JP | 2014090016 A | 5/2014 |
| WO | 2006121609 A1 | 11/2006 |
| WO | 2012137338 A1 | 10/2012 |

* cited by examiner

SEMICONDUCTOR DEVICE

CROSS-REFERENCE TO RELATED APPLICATIONS

This application claims priority from Japanese Patent Application No. 2015-161170 filed on Aug. 18, 2015, the disclosure of which is hereby incorporated herein by reference.

FIELD OF THE INVENTION

The present invention relates to a semiconductor device. Specifically, the present invention relates to a semiconductor device having a sealing material capable of self-repairing cracks and peeling if they appear.

BACKGROUND OF THE INVENTION

In conventional semiconductor devices that use a commonly used silicon (Si) semiconductor element, an epoxy resin and a silicone gel are used for sealing to secure the insulating properties. On the other hand, because SiC and GaN have electrical characteristics superior to those of Si, research and development of SiC and GaN have been conducted in recent years to commercialize semiconductor devices that use these materials. It is assumed that the material of semiconductor elements will be changed from Si to SiC and GaN in the future. Semiconductor elements constituted by SiC and GaN have high-temperature operation characteristics superior to those of Si semiconductor elements. It has been considered that SiC, in particular, is capable of operating at a temperature up to 300° C.

If SiC is used in a semiconductor element, the current density of the semiconductor element can be increased, but if the current density of a semiconductor element is high, the heat generation may increase and the temperature of the semiconductor element may become high. Accordingly, it is necessary to increase the heat performance of a sealing material to be used. If a silicone gel commonly used in conventional techniques is used as the sealing material, the silicone gel may degrade by oxidative degradation at a high temperature of 175° C. or more and under an oxygen atmosphere, which may lead to cracks in some cases. In addition, similarly to the above case, if a common epoxy resin is used as a sealing material, the resin may be oxidatively degraded and the problem of cracks may occur.

Self-repairing methods for repairing cracks in general plastic materials has been known. For example, JP 2008-052810 discloses fiber-reinforced plastic in which a plurality of capsule bodies encapsulating an adhesive is embedded. In addition, JP 2007-040491 discloses a laminated structure including a capsule filled with an adhesive and arranged between laminates of the laminated structure.

In semiconductor devices, a problem may occur such that if a crack has occurred in a sealing material such as an epoxy resin, the crack may develop and finally, cracks and peeling may occur in portions that need to be insulated.

BRIEF SUMMARY OF THE INVENTION

The present invention has been devised to solve the above-described problem. The inventors have conceived of using a resin having a function for self-repairing cracks or the like if any has occurred as a sealing material for semiconductors, and thus have completed the present invention. More specifically, according to an aspect of the present invention, a semiconductor device includes a member including a semiconductor element, an insulating substrate bonded onto one surface of the semiconductor element, and a printed circuit board for coupling with an external circuit connected to the other surface of the semiconductor element, which member being sealed with a sealing material, and the sealing material includes a first thermosetting resin and microcapsule particles containing a second thermosetting resin precursor.

In the semiconductor device, it is preferable that an average particle size of the microcapsule particles be 1 to 500 μm.

In the semiconductor device, it is preferable that the microcapsule particles contained in the sealing material be 0.1 to 10% by mass in terms of the mass of the sealing material.

In the semiconductor device, it is preferable that the microcapsule particles include a plurality of different types of microcapsule particles containing different second thermosetting resin precursors.

It is preferable that the microcapsule particle include a core portion including the second thermosetting resin precursor and a shell portion which covers the core portion.

In the semiconductor device, it is preferable that the shell portion of the microcapsule particle include at least two layers including a first coating contacting the core portion and a second coating which covers the first coating and includes ceramics or a resin.

In the semiconductor device, it is preferable that the microcapsule particle include a seamless capsule.

In the semiconductor device, it is preferable that the second thermosetting resin generated from the second thermosetting resin precursor be one or more resins selected from the group consisting of: epoxy resin, acryl resin, urethane resin, silicone resin, maleimide resin, or a silicone-modified resin thereof.

In the semiconductor device, it is preferable that the second thermosetting resin be a silicone-modified epoxy resin, and that the microcapsule particles include microcapsule particles containing a silicone modifier, microcapsule particles containing an epoxy base resin, and microcapsule particles containing a curing agent, which are included in separate and different particles.

In the semiconductor device, it is preferable that an elastic modulus of the second thermosetting resin be lower than an elastic modulus of the first thermosetting resin.

In the semiconductor device, it is preferable that a reaction for generating a second thermosetting resin from the second thermosetting resin precursor be a reaction caused by a catalyst and/or heat.

In the semiconductor device, it is preferable that the density of the microcapsule particles in a periphery of the insulating substrate be higher than the density of the microcapsule particles in a periphery of the semiconductor element.

Advantageous Effects of Invention

According to the semiconductor device of the present invention, if any crack has occurred in the sealing material, the microcapsule particles included in the thermosetting resin constituting the sealing material are broken, and the cracks and peels can be repaired by the component included in the microcapsule particles. Because the component contained in the microcapsule particles is liquid, when the component has flowed out from the particle, the leading edge portion of the crack can be reinforced with the component having flowed into the crack in its leading edge portion, and thus, the periphery of the substrate in which cracks may easily occur can be repaired, and thus, breakdown can be prevented and the service life of the semiconductor device can become longer. Accordingly, the semiconductor device of the present invention has an improved product life and a high reliability.

DETAILED DESCRIPTION [DESCRIPTION OF EMBODIMENTS]

Embodiments of the present invention will be described below with reference to attached drawings. However, the present invention is not limited to the embodiments described below.

According to an embodiment of the present invention, a semiconductor device includes a member including a semiconductor element, an insulating substrate bonded to one surface of the semiconductor element, and a printed wiring board for connection with an external circuit bonded to the other surface of the semiconductor element, which are sealed with a sealing material, in which the sealing material includes a first thermosetting resin and a microcapsule particle including a second thermosetting resin precursor.

Figure 1:
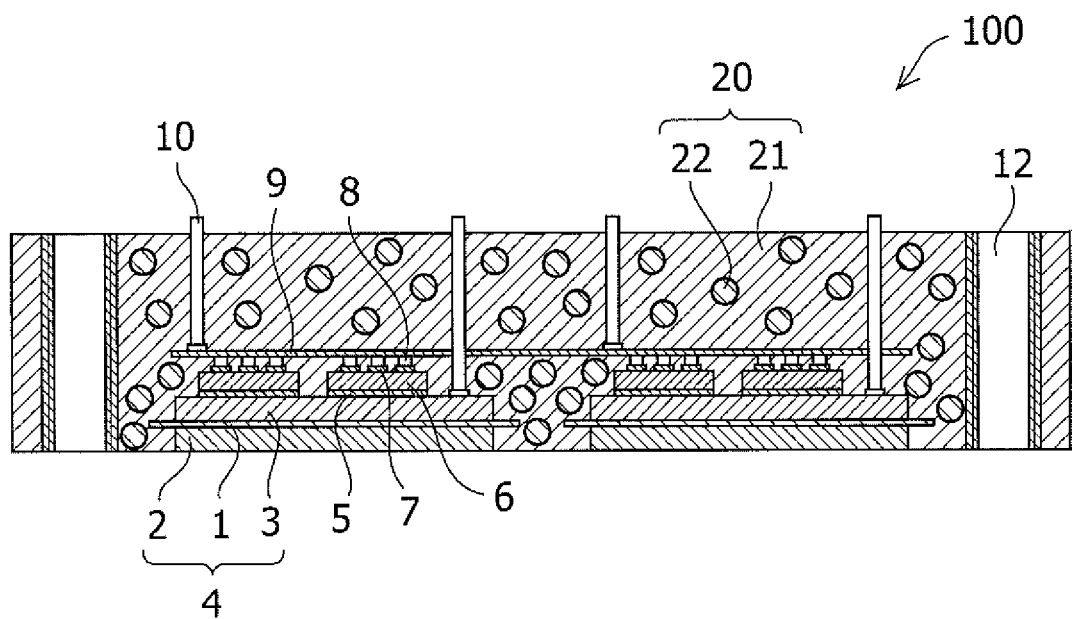
FIG. 1 is a conceptual diagram which illustrates a cross-sectional structure of a semiconductor module according to an embodiment of the present invention.

FIG. 1 is a diagram which schematically illustrates a cross-sectional structure of a semiconductor module which is an example of a semiconductor device according to an embodiment of the present invention. In a semiconductor module 100, a first copper block 2, which is substantially rectangular solid-shaped and arranged on a lower surface that is one surface of an insulating layer 1, and a second copper block 3, which is subsequent rectangular solid-shaped and arranged on an upper surface that is the other surface of the insulating layer 1, are arranged to constitute an insulating substrate 4. On the upper surface that is a surface of the insulating substrate 4 on the side of the second copper block 3, a plurality of SiC power semiconductor elements 6 is installed and mounted via a conductive bonding layer 5. Further, on an upper surface of the SiC power semiconductor element 6, an implant-type printed circuit board 9 including implant pins 8 is mounted via a conductive bonding layer 7. An external connection terminal 10 is mounted on an upper surface of the implant type printed circuit board 9 and on an upper surface of the second copper block 3, respectively, which enables electrical connection of the semiconductor module 100 with external devices. These members are sealed with a sealing layer including a sealing material 20. The sealing material 20 includes a first thermosetting resin 21 and microcapsule particles 22 including a second thermosetting resin precursor, and the sealing material 20 is heat-cured. In the sealing material 20, mounting brackets 12 are embedded, which are insertion holes for mounting the semiconductor module 100 to a cooling device (not illustrated). Note that the terms "upper surface" and "lower surface" herein are terms that express a relative position shown in the drawing used for mere explanation, and these terms will not limit the vertical direction in terms of the mode of use and the like of the semiconductor device.

The first thermosetting resin 21 may be a thermosetting resin usually used in semiconductor sealing resins and is a resin component that is heat-cured during production of semiconductor devices. This resin component is herein referred to as a "first thermosetting resin" to distinguish it from a thermosetting resin that is not heat-cured during production of the semiconductor device and held in the microcapsule particles 22 as a precursor. In particular, the glass transition temperature after curing of the thermosetting resin is the maximum operation temperature of the semiconductor element 6, and it is preferable that the glass transition temperature after curing of the thermosetting resin be 200° C. or more. Examples of the first thermosetting resin 21 include, but not limited to, one or more resins selected from the group consisting of epoxy resin, phenol resin, urea resin, unsaturated polyester resin, and melamine resin. It is particularly preferable to use an epoxy resin as the first thermosetting resin 21 in view of the heat resistance and the ease of handling.

If an epoxy resin is used as the first thermosetting resin 21, it is preferable that a cyclic aliphatic epoxy resin be used as an epoxy base resin; however, the epoxy base resin is not limited to this. For a curing agent, an acid anhydride-based curing agent is used. Specific examples of the acid anhydride-based curing agent include, but are not limited to, methyltetrahydrophthalic anhydride, tetrahydrophthalic anhydride, methylnadic anhydride, hexahydrophthalic anhydride, methylhexahydrophthalic anhydride, and isomers and modifiers thereof. In addition, for the acid anhydride-based curing agent, one of them can be used alone or two or more of them can be used in combination.

In addition to the curing agent, an auxiliary curing agent can be added as an optional component. This is intended to control the curing reaction. Specific examples of the auxiliary curing agent include, but are not limited to, imidazoles such as 2-ethyl-4-methylimidazole, tertiary amines such as benzyldimethylamine, aromatic phosphines such as triphenylphosphine, Lewis acids such as boron trifluoride monoethylamine, boric esters, organometallic compounds, organic acid metal salts, and the like.

The microcapsule particles 22 containing the second thermosetting resin precursor are particles that implement the self-repairing function in the present invention and are microcapsules containing a liquid or fluid second thermosetting resin precursor. To distinguish from the first thermosetting resin which is heat-cured during production of the semiconductor device, a thermosetting resin held in the microcapsule particle 22 as a precursor during production of the semiconductor device and produced by a reaction of the precursor if a crack has occurred will be herein referred to as a "second thermosetting resin". The term "resin precursor" refers to a monomer, a dimer, or an oligomer of an uncured resin and preferably refers to molecules that are capable of stably existing in a microcapsule particle as liquid without being cured. In addition, the second thermosetting resin precursor according to the present invention not only include the above-described substances but also optional substances that can be used in a reaction for polymerizing the second thermosetting resin, such as auxiliary curing agent, catalyst, polymerization initiator, solvent, fire retardant, antioxidant, pigment, and the like.

Figure 2:
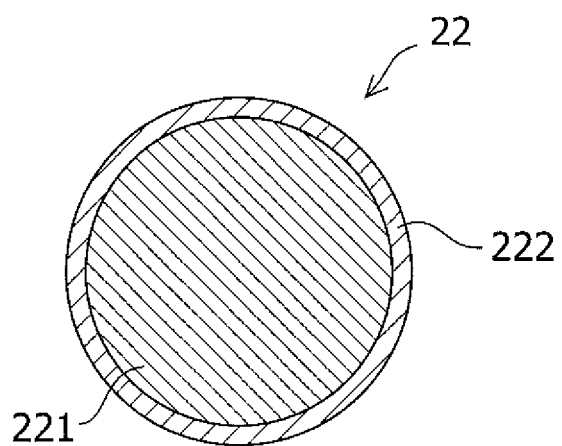
FIG. 2 is a conceptual diagram which illustrates a cross-sectional structure of microcapsule particles containing a second thermosetting resin precursor.

FIG. 2 is a diagram which schematically illustrates an example of the microcapsule particle 22. The microcapsule particle 22 is constituted at least by a core portion 221 and a shell portion 222, and the core portion 221 which is arranged on the inner side includes a liquid second thermosetting resin precursor. The outer shell portion 222 is configured to encapsulate a liquid resin precursor. The outer shell portion 222 preferably stably protects the liquid second thermosetting resin precursor, and is preferably a coating having a high adhesion to the first thermosetting resin 21. The microcapsule particle having the above-described configuration may be a seamless capsule including the liquid second thermosetting resin precursor covered with a coating constituted by a material such as gelatine, carrageenan, gum arabic, and alginate, for example. Alternatively, the microcapsule particle may, although not illustrated in the drawing, include a structure of three or more layers having a shell portion including at least two layers constituted by a first coating contacting a core portion including the liquid second thermosetting resin precursor and a second coating that covers the first coating and includes ceramics or a resin. Even if the structure including three or more layers is employed, the microcapsule particle can be produced more readily by previously forming the above-described seamless capsule with a predetermined shape and by covering the outside of the seamless capsule with a coating constituted by ceramics or a resin. In addition, because the coating constituted by ceramics or a resin yields a relatively hard outer shell, it becomes easier for the microcapsule particle 22 to break when a crack has occurred, which enables easy release of the second thermosetting resin precursor held inside the particle. The microcapsule particle 22 illustrated in FIG. 2 has a substantially spherical shape, which is preferable in terms of not increasing the viscosity of the first thermosetting resin. However, the shape of the microcapsule particle is not particularly limited.

Preparation of the microcapsule particle can be implemented by encapsulating the liquid second thermosetting resin precursor enveloped with a coating by using a phase separation method into a microcapsule, for example. The microcapsule particle can be appropriately produced by a person skilled in the art based on various other conventional techniques. In addition, the particle size and the member constituting the shell portion can be modified. Alternatively, a commercial product can be used as the microcapsule encapsulating an epoxy resin, for example.

An average particle size of the microcapsule particle 22 is preferably 1 to 500 μm, more preferably 20 to 200 μm, yet more preferably 30 to 80 μm. The term "average particle size" of the particle herein refers to an average of values measured by a laser diffraction scattering method. If the average particle size is larger than 500 μm, it may become easier for the microcapsule particle 22 to easily break during the production of the microcapsule particle 22. In contrast, if the average particle size is smaller than 1 μm, it may become difficult to produce the microcapsule particle 22. Note that the term "microcapsule" herein should be interpreted in a broad sense and may include nano-order particles smaller than 1 μm and particles on the order of millimeter that are larger than 1,000 μm. The content of the microcapsule particle 22 in relation to the whole sealing material 20 is preferably 0.1 to 10% by mass, more preferably 1 to 6% by mass, in relation to the total mass of all the components constituting the sealing material 20 as 100%. This is intended to obtain the self-repairing effect of the microcapsule particle 22 without changing the characteristics of the first thermosetting resin 21. If the microcapsule particle 22 includes a plurality of types of microcapsule particles containing different precursors, it is preferable that the total amount of the particles be in the above-described range.

It is preferable that the microcapsule particle 22 include the second thermosetting resin precursor and stably exist without being broken during production of the semiconductor module 100 and that it function so as to release the precursor included therein by breaking when a crack has occurred in the sealing material 20. In addition, the plurality of different types of inclusions react under the use of the semiconductor module 100 to generate the second thermosetting resin precursor, and the generated second thermosetting resin precursor flows into the crack or the peeled portion and can fill in the crack or the crevice. Accordingly, a person skilled in the art can design the microcapsule particle 22 so that the precursor to be included therein and the type and the mass ratio of the precursor may satisfy conditions for generating a predetermined second thermosetting resin precursor from a predetermined precursor after the microcapsule particle 22 has been broken. It is preferable to select the predetermined precursor so that the polymerization reaction for generating the second thermosetting resin precursor may appropriately progress under conditions of use of the semiconductor module 100, i.e., for example, by assuming the reaction to be promoted by chemical substances that can be included in the microcapsule particle 22, catalysts such as oxygen that can be supplied from around due to the cracks that have occurred, or by the heat.

In the present invention, examples of the second thermosetting resin which is useful for repair cracks include, not are but limited to, one or more selected from the group consisting of silicone resin, epoxy resin, acryl resin, urethane resin, and maleimide resin. Among them, epoxy resin, acryl resin, urethane resin, and maleimide resin are more useful because they have a high adhesion.

It is preferable that the second thermosetting resin have a low elastic modulus (Young's modulus) compared particularly with that of the first thermosetting resin. If the elastic modulus of the second thermosetting resin precursor that has been cured after coming into a crack is low, the viscosity of the resin on the leading edge of the crack may become low and the stress may be ameliorated, and thereby an advantage can be obtained such that expansion of the crack can be prevented. Specifically, a silicone resin can be used as the second thermosetting resin. Alternatively, it is preferable to use a thermosetting resin that has been silicone-modified in relation to a specific resin constituting the first thermosetting resin, as the second thermosetting resin precursor. If an epoxy resin is used as the first thermosetting resin, a silicone-modified epoxy resin can be used as the second thermosetting resin precursor. The silicone-modified epoxy resin can be obtained by mixing generally used epoxy base resin, a curing agent and a silicone monomer as the modifier to react them. If a resin other than a silicone-modified thermosetting resin is used, it is preferable that the resin to be used has a viscosity lower than that of the first thermosetting resin by using a resin having an alicyclic group or a chain skeleton as the second thermosetting resin precursor. Note that if a capsule filled with a conventionally used adhesive is used to suppress expansion of cracks, distortion in the semiconductor device itself cannot be prevented, the semiconductor device may finally break, and thus self-repair cannot be implemented. This is because the elastic modulus of the conventional adhesive is lower than 1 GPa, which is too low compared with the elastic modulus of a normal thermosetting sealing material which is 10 to 20 GPa.

It is preferable that the microcapsule particle 22 include one or more microcapsule particles in which one or more second thermosetting resin precursors, which are substances necessary for generating the second thermosetting resin, are respectively included in different capsules. The particle size of the particles may be either the same or different. Specifically, it is preferable that the ratio of the number of the microcapsule particles and the size thereof be adjusted so that one or more precursors satisfy the condition of a desired equivalent weight ratio as a whole. Accordingly, if a silicone-modified epoxy resin is used as the second thermosetting resin precursor, for example, microcapsule particles encapsulating silicone, microcapsule particles encapsulating an epoxy base resin, microcapsule particles encapsulating a curing agent, and microcapsule particles encapsulating an auxiliary curing agent can be prepared separately from one another.

It is preferable that the sealing material further include inorganic filler. This is intended to increase the glass transition temperature of the sealing material and impart the sealing material with heat resistance. The inorganic filler is not particularly limited and may be an inorganic filler that is usually added to semiconductor sealing resins. Specifically, it is preferable to use a filler known as a "nanofiller", which has an average particle size of 1 to 100 nm or a preferable average particle size of 5 to 50 nm, and a filer known as a "microfiller", which has an average particle size of 10 to 100 μm or a preferable average particle size of 50 to 80 μm. This is intended to increase the heat resistance of the resin. The term "average particle size" herein refers to an average of values measured by a laser diffraction scattering method. The compound constituting the inorganic filler may be, but is not limited to, one or more selected from the group consisting of $SiO_2$, BN, $Al_2O_3$, MN, and $Si_3N_4$. It is preferable that the content of the nanofiller be 0.1 to 25% by mass, and preferably 1 to 15% by mass, in relation to the total mass of the sealing material as 100%. This is intended considering the heat resistance characteristics and the viscosity characteristics. On the other hand, it is preferable that the content of the microfiller be 50 to 80% by mass in relation to the total mass of the sealing material including the filler as 100%. The microfiller and the nanofiller can be appropriately mixed together.

Further, as optional components, additives usually added to semiconductor sealing resins may be included. Examples of the additive include, but are not limited to, a flame retarder, a pigment for coloring resins, and a plasticizer and a silicone elastomer used for increasing the anti-crack properties. One skilled in the art can appropriately determine the content of the optional components according to a specification of the semiconductor device to be produced.

In the sealing layer of the semiconductor module 100 illustrated in FIG. 1, the microcapsule particles 22 may exist uniformly in the sealing material 20. Alternatively, the microcapsule particle 22 may exist in the sealing material 20 so that the number of the microcapsule particles 22 existing in one portion may become greater than those in the other portions. According to an embodiment, the density of the microcapsule particles 22 around the insulating substrate 4 may be greater than the density of the microcapsule particles 22 around the semiconductor element 6. This is because during production of the semiconductor device, it is likely that the stress is applied centrally in peripheral edges of insulating substrate 4, particularly on corners thereof, and thus, these edges and corners may often become the starting point of cracks.

Next, the semiconductor module 100 illustrated in FIG. 1 will be described in terms of a production method thereof. The production method of the SiC power semiconductor module 100 primarily includes steps of assembling a member including the insulating substrate 4, the semiconductor element 6, and the printed circuit board 9 bonded together and sealing the member with a resin.

The step of assembling the member including the insulating substrate 4, the semiconductor device 6, and the printed circuit board 9 bonded together includes a step of forming the insulating substrate 4, which includes the first copper block 2 and the second copper block 3 bonded on both surfaces of the insulating layer by thermocompression; a step of mounting one or more SiC power semiconductor elements 6 on one surface of the insulating substrate 4 via a conductive bonding layer a5; a step of mounting the implant type printed circuit board 9 including the implant pins 8 via a conductive bonding layer b7; and a step of coupling the external connection terminals 10 with the second copper block 3 and the printed circuit board 9.

For the assembling step, specifications of the members to be used, and the like may be based on normal methods disclosed in conventional techniques. For example, the processes described in Japanese Patent Application Laid-Open No. 2013-004729 corresponding to US2014/0124936 A1, the entire contents of which are incorporated by reference herein, and Japanese Patent Application Laid-Open No. 2012-191010 applied by the applicant of the present invention can be applied except for the resin sealing step.

For production of the sealing material 20, the microcapsule particles 22 are separately prepared as necessary, then a precursor of the first thermosetting resin 21, the microcapsule particles 22, an optionally added inorganic filler, and an optionally added other additives are mixed together to obtain a composition before curing of the sealing material 20. Next, the composition before curing is deaerated under reduced pressure under normal conditions and the composition before curing is applied to mold it into a predetermined shape by a molding method such as transfer molding, liquid transfer molding, potting, and injection molding. If the existence density of the microcapsule particles 22 in the sealing layer is to be distributed, an uncured composition of a plurality of sealing materials having different content ratios contained in the microcapsule particles 22 may be prepared to implement stepwise sealing. Subsequently, holes for inserting the mounting brackets 12 are formed through the sealing material, a step of inserting the mounting brackets 12 into the holes after the sealing material 20 has cured is carried out, and thus, the semiconductor module 100 can be obtained.

Figure 3A:
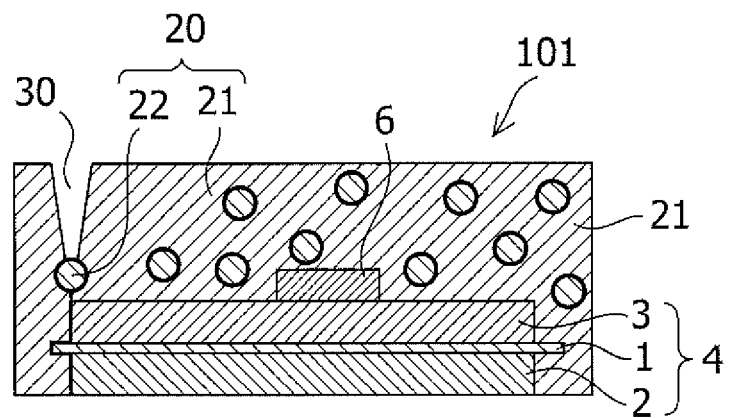
FIGS. 3(a)-(b) are diagrams which schematically illustrate self-repairing of cracks in a semiconductor module according to an embodiment of the present invention.

Next, a self-repairing mechanism of the semiconductor device according to the present embodiment will be described with reference to FIG. 3. FIG. 3(a) illustrates a semiconductor module 101, in which a crack 30 has occurred in the sealing material 20 starting from a corner of the insulating substrate 4 due to long-term use. The crack 30 may often occur usually starting from an edge of the insulating substrate 4. If the crack 30 has occurred, the microcapsule particles 22 located in the portion of the crack 30 are broken by being pulled by the first thermosetting resin 21, to which the shell portion 222 of the microcapsule particles 22 is bonded, and are thus broken and the resin precursor 221 included therein flows out. In the drawing, a state in which one of the microcapsule particles 22 is located in the portion in which the crack 30 has occurred is illustrated for simplification. However, in actuality, a plurality of microcapsules 22 existing along the crack is broken substantially at the same time and the resin precursors extend along the crack. In an embodiment, a plurality of types of microcapsule particles including different types of resin precursors is broken, or in an alternative embodiment, microcapsule particles including substances such as catalysts is broken at the same time, and thus, these substances are mixed together to cause a polymerization reaction.

Figure 3B:
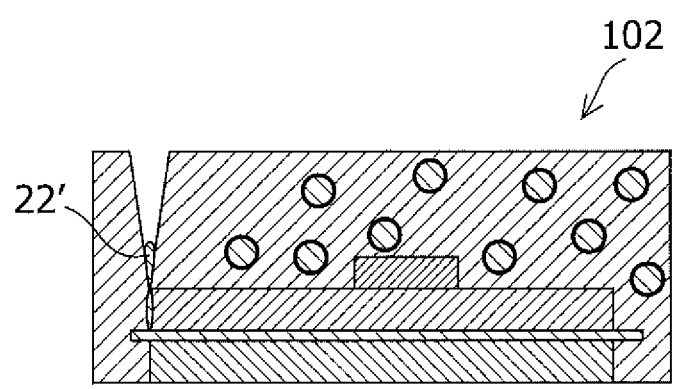

FIG. 3(b) is a diagram which schematically illustrates a semiconductor module 102, in which the crack has been repaired. A second thermosetting resin 22' is generated in the crack. In the semiconductor module 101, it is possible that the temperature of the sealing material becomes as high as 80 to 150° C., particularly due to heat from the semiconductor device generated during operation of the device. If the microcapsule particles 22 are broken under the condition described above, the reaction among the precursors that flow out may be promoted.

It has been known that in conventional semiconductor modules, if cracks may occur, they may often occur in a direction extending in a substantially vertical direction from the upper surface of the sealing material, i.e., a surface opposite to the insulating substrate 4, toward a peripheral edge of the insulating substrate, similarly to the example illustrated in FIG. 3(a). In the present invention, the liquid resin precursor is included in the microcapsule particle 22, and thus, the resin precursor flows along the crack to repair a crack or a peeled portion occurring around the substrate in which a problem may occur due to breakdown, and thereby appropriate insulating properties can be secured.

EXAMPLE

The semiconductor module according to the embodiment of the present invention illustrated in FIG. 1 is produced. The member constituted by the insulating substrate 4, the semiconductor device 6, and the printed circuit board 9 bonded together is assembled according to the semiconductor module production method in the above-described embodiment.

A sealing material is prepared which includes the first thermosetting resin, microcapsule particles including the second thermosetting resin precursor, and a microfiller. For the first thermosetting resin, equivalents of a bisphenol A type epoxy resin and an acid anhydride-based curing agent are mixed together, and an auxiliary curing agent is added to the obtained mixture. For the microcapsule particles containing the second thermosetting resin precursor, base microcapsule particles including a shell portion formed with gelatine and containing an epoxy base resin (Epoxy Resin 871, a product of Mitsubishi Chemical Corp.), curing agent microcapsule particles including a shell portion formed with gelatine and containing an acid anhydride-based curing agent (YH306, a product of Mitsubishi Chemical Corp.), and an auxiliary curing agent microcapsule particles containing an auxiliary curing agent are prepared by a phase separation method. All of these microcapsule particles are prepared and adjusted so that the average particle size is 50 μm, that the ratio between the included base agent and the curing agent is equivalent in terms of the ratio of the number of the microcapsule particles, and that the amount of the auxiliary curing agent becomes the above-described percent by mass. The three types of the microcapsule particles are mixed together so that the amount thereof becomes 5% by mass in terms of the total mass of the sealing material. For the microfiller, SiO2 with the average particle size of 70 μm is mixed so that its amount becomes 70% by mass in terms of the total mass of the sealing material. All of them are mixed together, the mixture is stirred by using a stirrer, etc., to obtain a composition before curing of the sealing material.

This composition before curing is previously heated to 40° C. to 80° C. to decrease the viscosity of the resin, then the heated composition is subjected to a vacuum state of 0.1 Torr (13.33 Pa) for 10 minutes under heating at the above-described temperature, and thereby primary deaeration is carried out. Then the resultant is poured into a cylinder-like vessel, and the above-described bonded member is sealed by cast molding. To remove the bubbles entrained during the cast molding, secondary deaeration is carried out by a process similar to that for the primary deaeration after the cast molding. The heat setting is carried out at 100° C. for 1 hour and at 180° C. for 1 hour. In the above-described manner, the semiconductor module according to the embodiment is produced.

Subsequently, a semiconductor device for a Comparative Example is produced in a manner similar to that in the Example except that the microcapsule particles containing the second thermosetting resin precursor are not mixed.

To evaluate the reliability of the semiconductor module of the obtained Example and the Comparative Example, a heat cycle test is carried out. For the heat cycle, one cycle includes keeping the module at −40° C. for 30 minutes, and on the high-temperature side, one cycle includes keeping the module at 150° C. for 30 minutes. In the semiconductor module of the Comparative Example, breakdown occurs after 200 cycles. In contrast, in the semiconductor module of the Example, no breakdown occurs even after 1,000 cycles. By observing the cross section of the semiconductor module of the Example after 1,000 cycles with a microscope, it is observed that a trace of a crack exists around the insulating substrate but the microcapsule particles have been broken to fill the crack and have prevented breakdown from occurring.

INDUSTRIAL APPLICABILITY

The semiconductor device according to the present invention is useful in a semiconductor power module sealed with a thermosetting resin.

REFERENCE SIGNS LIST

1 Insulating layer
2 First copper block
3 Second copper block
4 Insulating substrate
5 Conductive bonding layer
6 SiC semiconductor device
7 Conductive bonding layer
8 Implant pin
9 Implant type printed circuit board
12 Mounting bracket
20 Sealing material
21 First thermosetting resin
22 Microcapsule particle
22' Second thermosetting resin
30 Crack
100 Semiconductor module (semiconductor device)

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A semiconductor device comprising a member including a semiconductor element, an insulating substrate bonded onto one surface of the semiconductor element, and a printed circuit board for coupling with an external circuit connected to a second surface of the semiconductor element, the second surface opposite the first surface, which member being sealed with an insulating sealing material, wherein the sealing material comprises a first thermosetting resin and microcapsule particles containing a second thermosetting resin precursor, wherein the first thermosetting resin contacts the second surface of the semiconductor element, wherein the microcapsule particles have a greater density around the insulating substrate than around the semiconductor element.

2. The semiconductor device according to claim 1, wherein an elastic modulus of the second thermosetting resin is lower than an elastic modulus of the first thermosetting resin.

3. The semiconductor device according to claim 1, wherein an average particle size of the microcapsule particles is 1 to 500 μm.

4. The semiconductor device according to claim 3, wherein the second thermosetting resin generated from the second thermosetting resin precursor is one or more resins selected from the group consisting of: epoxy resin, acryl resin, urethane resin, silicone resin, maleimide resin, or a silicone-modified resin thereof.

5. The semiconductor device according to claim 4,
  wherein the second thermosetting resin is a silicone-modified epoxy resin, and
  wherein the microcapsule particles include microcapsule particles containing a silicone modifier, microcapsule particles containing an epoxy base resin, and microcapsule particles containing a curing agent, which are included in separate and different particles.

6. The semiconductor device according to claim 1, wherein the microcapsule particle includes a core portion including the second thermosetting resin precursor and a shell portion which covers the core portion.

7. The semiconductor device according to claim 6, wherein the shell portion of the microcapsule particle includes at least two layers including a first coating contacting the core portion and a second coating which covers the first coating and includes ceramics or a resin.

8. The semiconductor device according to claim 6, wherein the microcapsule particle includes a seamless capsule.

9. The semiconductor device according to claim 1, wherein a reaction for generating a second thermosetting resin from the second thermosetting resin precursor is a reaction caused by a catalyst and/or heat.

10. The semiconductor device according to claim 3, wherein the microcapsule particles include a plurality of different types of microcapsule particles containing different second thermosetting resin precursors.

11. The semiconductor device according to claim 1, wherein the microcapsule particles contained in the sealing material is 0.1 to 10% by mass in terms of the mass of the sealing material.

12. The semiconductor device according to claim 1, wherein the microcapsule particles are distributed throughout the first thermosetting resin.

* * * * *